(12) United States Patent
Zhu et al.

(10) Patent No.: US 8,816,392 B2
(45) Date of Patent: Aug. 26, 2014

(54) SEMICONDUCTOR DEVICE HAVING GATE STRUCTURES TO REDUCE THE SHORT CHANNEL EFFECTS

(75) Inventors: Huilong Zhu, Poukeepsie, NY (US); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/121,998

(22) PCT Filed: Mar. 2, 2011

(86) PCT No.: PCT/CN2011/000336
§ 371 (c)(1),
(2), (4) Date: Mar. 31, 2011

(87) PCT Pub. No.: WO2012/000300
PCT Pub. Date: Jan. 5, 2012

(65) Prior Publication Data
US 2012/0001229 A1    Jan. 5, 2012

(30) Foreign Application Priority Data
Jul. 1, 2010   (CN) .......................... 2010 1 0223858

(51) Int. Cl.
*H01L 29/66* (2006.01)
*H01L 33/00* (2010.01)
*H01L 21/02* (2006.01)

(52) U.S. Cl.
CPC ............... *H01L 29/66* (2013.01); *H01L 33/00* (2013.01); *H01L 21/02* (2013.01)
USPC .............................. 257/192; 257/94; 257/190

(58) Field of Classification Search
CPC ............ H01L 21/28273; H01L 29/785; H01L 29/66803; H01L 29/66825; H01L 29/66795
USPC ........... 257/135–136, 192, 242, 365–369, 94, 257/190
See application file for complete search history.

(56) References Cited

U.S. PATENT DOCUMENTS 5,461,250 A * 10/1995 Burghartz et al. ............. 257/347
6,396,108 B1 * 5/2002 Krivokapic et al. .......... 257/365
6,800,885 B1 * 10/2004 An et al. ........................ 257/275
7,202,517 B2 * 4/2007 Dixit et al. .................... 257/287

(Continued)

FOREIGN PATENT DOCUMENTS

CN   101369584       2/2009
EP    2026378 A2     2/2009

OTHER PUBLICATIONS

International Search Report PCT/CN2011/000336.

*Primary Examiner* — Long K Tran
*Assistant Examiner* — Dzung Tran
(74) *Attorney, Agent, or Firm* — Troutman Sanders LLP (57) ABSTRACT

A semiconductor device comprises a semiconductor substrate on an insulating layer; and a second gate that is located on the insulating layer and is embedded at least partially in the semiconductor substrate. A method for forming a semiconductor device comprises: forming a semiconductor substrate on an insulating layer; forming a void within the semiconductor substrate, with the insulating layer being exposed by the void; and forming a second gate, with the void being filled with at least one part of the second gate. It facilitates the reduction of the short channel effects, resistances of the source and drain regions, and parasitic capacitances.

11 Claims, 9 Drawing Sheets

(56) References Cited

U.S. PATENT DOCUMENTS

| | | | |
|---|---|---|---|
| 2004/0219722 A1* | 11/2004 | Pham et al. | 438/157 |
| 2005/0145941 A1* | 7/2005 | Bedell et al. | 257/348 |
| 2005/0156202 A1* | 7/2005 | Rhee et al. | 257/213 |
| 2005/0156233 A1* | 7/2005 | Lin | 257/330 |
| 2005/0282345 A1 | 12/2005 | Mathew et al. | |
| 2006/0202270 A1* | 9/2006 | Son et al. | 257/349 |
| 2007/0090443 A1 | 4/2007 | Choi et al. | |
| 2007/0278572 A1 | 12/2007 | Ban et al. | |

\* cited by examiner

SEMICONDUCTOR DEVICE HAVING GATE STRUCTURES TO REDUCE THE SHORT CHANNEL EFFECTS

BENEFIT CLAIMS

This application is a US National Stage of International Application No. PCT/CN2011/000336 filed Mar. 2, 2011, which claims the benefit of CN 201010223858.6, filed Jul. 1, 2010

FIELD OF THE INVENTION

The present invention relates to the field of semiconductor technology, and particularly, to a semiconductor device and a method for forming the same.

BACKGROUND OF THE INVENTION

With the continued scaling of the channel length of MOS-FETs (Metal Oxide Field-effect Transistors), a series of effects, which are ignorable in a long-channel MOSFET, are becoming more and more significant and are even becoming a dominant factor in affecting performance These effects are collectively referred to as the short-channel effects. The increase of short-channel effects tend to deteriorate the electrical performance of a device, for example, causing the problems of reducing the threshold voltage of a gate, increasing the power consumption, reducing the signal to noise ratio, etc.

In order to control the short-channel effects, more impurity elements (such as phosphorus, boron, etc.) have to be doped into a channel, but this tends to lead to the reduced carrier mobility in the channel of the device. Moreover, there is a problem that it is difficult to control the distribution abruptness of the impurities doped into the channel, which tends to cause severe short-channel effects. The traditional SiGe PMOS strained silicon technology also encounters bottleneck problems, making it difficult to provide stronger strain for the channel. Furthermore, in aspects of the thickness of a gate oxide dielectric, there is also a bottleneck problem that it is difficult for the speed of reducing the gate oxide thickness to keep pace with that of reducing the gate width, and the leakage current in the gate dielectric becomes larger and larger. In addition, the critical dimensions are decreasing continuously, causing the resistance of the source/drain regions to increase continuously and the power consumption of the device to become higher and higher.

Currently, the dominant thinking in the industry is to improve the traditional planar device technology, trying to reduce the thickness of the channel region and to eliminate the electrical neutral layer under the depletion layer in the channel so that the depletion layer in the channel can fill up the whole channel region, which is the so-called fully depleted (FD) device while the traditional planar devices belong to the partially depleted (PD) devices.

However, in order to fabricate the fully depleted device, an extremely thin thickness of the channel silicon layer is required. The traditional manufacturing process, particularly the traditional bulk silicon-based manufacturing process, has difficulties in fabricating a structure meeting such requirements, or the costs are high. Even for the newly developed SOI (Silicon-On-Insulator) process, it is still difficult to control the thickness of the channel silicon layer at a relatively thin level. Regarding how to realize the fully depleted device, the focus of R&D efforts is turning to a 3-dimensional device structure, i.e., to a fully depleted dual-gate or tri-gate technology.

The 3-dimensional device structure (also referred to as a vertical device in some documents) refers to a device structure in which the cross section of the source/drain region and that of the gate are not in the same plane, which substantially belongs to a FinFet (Fin Field-effect Transistor) structure.

After turning to the 3-dimensional device structure, the channel region is no longer contained in the bulk silicon or SOI, and rather, it becomes independent from these structures. Therefore, the fully depleted channel with extremely thin thickness can be fabricated by means of etching, etc.

Figure 1:
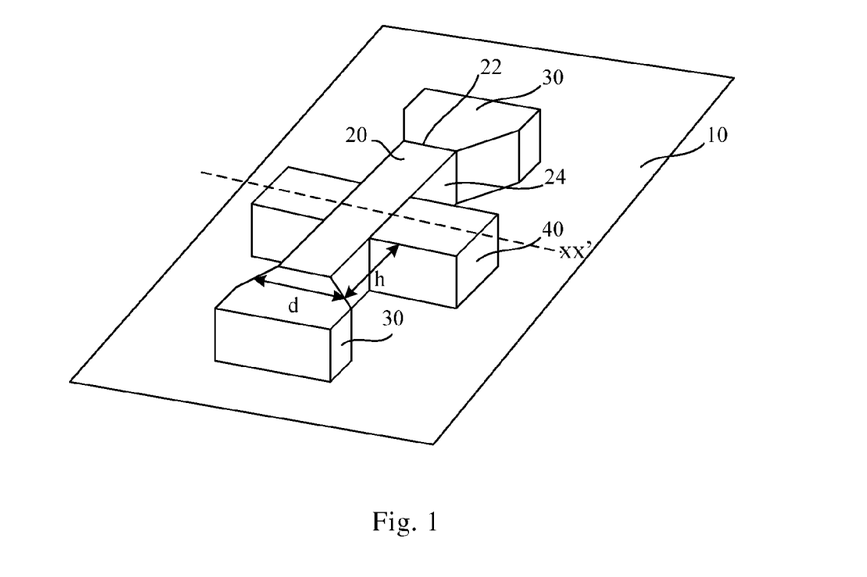
FIG. 1 is a schematic diagram of the structure of a semiconductor device in the prior art.

FIG. 1 shows a 3D semiconductor device which has been proposed, the semiconductor device comprising: a semiconductor substrate 20 that is located on an insulating layer 10; source and drain regions 30 abutting first opposite sides 22 of the semiconductor substrate 20; gates 40 that are located on second sides 24 of the semiconductor substrate 20, which are adjacent to the first sides 22 (a gate dielectric layer and a work function metal layer sandwiched between the gates 40 and the semiconductor substrate 20 are not shown in the figure). In this case, in order to reduce the resistances of the source and drain regions, the edge of the source and drain regions 30 may be expanded, i.e., the width of the source or drain region 30 (along the xx' direction) is larger than the thickness of the semiconductor substrate 20. Therefore, with the increase of the width (d) of the source and drain regions 30, the parasitic capacitances between the source or drain region 30 and the gate 40, and between the source or drain region 30 and the semiconductor substrate 20 increase, thus increasing the resistance-capacitance delay or decreasing the alternative current performance of the device.

SUMMARY OF THE INVENTION

In order to solve the above mentioned problems, the present invention provides a semiconductor device and a method for forming the same, which facilitate the reduction of the short-channel effects, the resistances of the source and drain regions, and the parasitic capacitances.

The semiconductor device as provided by the present invention comprises:
 a semiconductor substrate on an insulating layer;
 source and drain regions abutting first opposite sides of the semiconductor substrate;
 first gates, which are located on second opposite sides of the semiconductor substrate; and
 a second gate, which is located on the insulating layer and is embedded at least partly in the semiconductor substrate;
 wherein, the second gate comprises:
 a floating gate on the semiconductor substrate, wherein a first dielectric layer is sandwiched between the floating gate and the semiconductor substrate;
 a control gate on the floating gate, wherein a second dielectric layer is sandwiched between the control gate and the floating gate.

Optionally, a channel layer and a mask layer are formed between the top part of the first dielectric layer and the semiconductor substrate, and the channel layer is formed between the semiconductor substrate and the mask layer.

Optionally, the channel layer has a thickness of 5 nm to 40 nm in a direction perpendicular to the second sides.

Optionally, in a direction perpendicular to the insulating layer, the first gate or the floating gate covers at least the channel layer.

Optionally, the material of the floating gate and/or the control gate is one of TiN, TiAlN, TaN or TaAlN, or a combination thereof.

Optionally, the material of the first dielectric layer and/or the second dielectric layer is one of hafnium-based oxides.

Optionally, the first sides are perpendicular to the second sides.

Optionally, the semiconductor device further comprises a semiconductor assistant substrate, wherein the upper surface of the semiconductor assistant substrate is lower than the upper surface of the semiconductor substrate, the semiconductor assistant substrate abuts the first sides, and the source and drain regions are formed on the semiconductor assistant substrate.

Optionally, the semiconductor assistant substrate contains Si. For a PMOS device, the source and drain regions are $Si_{1-x}Ge_x$; and for an NMOS device, the source and drain regions are Si:C.

Optionally, in the $Si_{1-x}Ge_x$, X has a value ranging from 0.1 to 0.7.

Optionally, in the Si:C, the value of the atomic number percentage of C is in a range of 0.2% to 2%.

The method for forming the semiconductor device as provided by the present invention comprises:

forming a semiconductor base structure on an insulating layer;

forming source and drain regions abutting first opposite sides of the semiconductor base structure;

forming first gates, which are located on second opposite sides of the semiconductor base structure;

removing a part of material within the semiconductor base structure to form a void in the semiconductor base structure, with the insulating layer being exposed by the void; and forming a second gate, with the void being filled with at least one part of the second gate;

wherein, the step of forming the second gate comprises:

forming a floating gate on the semiconductor base structure, wherein a first dielectric layer is sandwiched between the floating gate and the semiconductor base structure; and forming a control gate on the floating gate, wherein a second dielectric layer is sandwiched between the control gate and the floating gate.

Optionally, the step of forming the semiconductor base structure comprises:

forming on the insulating layer a first semiconductor layer, a stopper layer, a patterned sacrifice layer, a patterned protection layer, and a first sidewall spacer surrounding the patterned sacrifice layer and the protection layer;

patterning the stopper layer and the first semiconductor layer with the first sidewall spacer as a mask;

defining areas for the source and drain regions and removing the first sidewall spacer, the protection layer, and the sacrifice layer, so as to expose the stopper layer;

forming a second sidewall spacer surrounding the protection layer and the sacrifice layer;

wherein, the source and drain regions abut first opposite sides of the patterned first semiconductor layer;

the first gates are located on second opposite sides of the patterned first semiconductor layer; and wherein, the step of forming the void within the semiconductor base structure comprises:

removing the protection layer, the sacrifice layer and the first semiconductor layer with the first sidewall spacer and the second sidewall spacer as the mask, the material of the stopper layer being different from the materials of the protection layer, the sacrifice layer, the first semiconductor layer, the first sidewall spacer and the second sidewall spacer.

Optionally, the first sides are perpendicular to the second sides.

Optionally, in the direction perpendicular to the second sides, the first sidewall spacer has a thickness of 5 nm to 40 nm.

Optionally, the step of forming the source and drain regions comprises:

after forming the semiconductor base structure, removing the stopper layer located in the areas for the source and drain regions and the first semiconductor layer of a partial thickness, so as to form a source/drain base layer; and forming a second semiconductor layer on the source/drain base layer.

Optionally, the first semiconductor layer contains Si. For a PMOS device the second semiconductor layer is $Si_{1-x}Ge_x$; and for an NMOS device, the second semiconductor layer is Si:C.

Optionally, in the $Si_{1-x}Ge_x$, X has a value ranging from 0.1 to 0.7.

Optionally, in the Si:C, the value of the atomic number percentage of C is in a range of 0.2% to 2%.

Optionally, before forming the second semiconductor layer on the source/drain base layer, the method further comprises performing a first ion implantation in a direction towards the first sides, so as to form a diffusion region and a halo.

Optionally, the step of forming the first gates comprises:

forming a gate stack before defining the areas for the source and drain regions, with the gate stack covering at least the patterned first semiconductor layer in a direction perpendicular to the insulating layer.

Optionally, the material of the floating gate and/or the control gate is one of TiN, TiAlN, TaN or TaAlN, or a combination thereof.

Optionally, the material of the first dielectric layer and/or the second dielectric layer is one of hafnium-based oxides.

Compared with the prior art, by employing the technical solution as provided by the present invention, it has the following advantages.

By forming the second gate embedded at least partially in the semiconductor substrate, for a semiconductor substrate having a channel region of the same thickness as that in prior art, the distance between the first gates formed on second sides of the semiconductor substrate can be increased, which further increases the distance h' between a first gate and the source/drain region, thus facilitating the reduction of parasitic capacitances. Furthermore, due to the introduction of the second gate, provided that the height of the semiconductor substrate is kept constant, the lateral area of the semiconductor substrate having a channel region of the same thickness as that in prior art is increased, and so is the cross sectional area of the source/drain region abutting the semiconductor substrate (because of the increase of the width d' of the source/drain region), thus facilitating a further reduction of the resistances of the source and drain regions. Moreover, by introducing the second gate, a division region is formed between the source and drain regions, which facilitates the reduction of short-channel effects. Still further, since the second gate is embedded at least partially in the semiconductor substrate, the use of the channel layer close to the first gate is facilitated; and, for the second gate, the thickness range of the first dielectric layer and/or the second dielectric layer therein can be larger. In addition, by using the semiconductor device according to the present invention, the first gates can be used as a switch, and the second gate can be used to realize data storage functions.

By forming the sacrifice layer on the semiconductor layer which is on the insulating layer, with the first and second sidewall spacers surrounding the sacrifice layer, and then using the first and second sidewall spacers as a hard mask to form the semiconductor substrate in a self alignment manner, the number of the masks needed can be reduced and the process can be refined. Moreover, by having the first gates or the floating gate cover at least the channel layer in a direction perpendicular to the insulating layer, the effective area of the channel region can be increased and the carrier mobility in the channel region can be enhanced.

By forming the semiconductor assistant substrate and then forming source and drain regions on the semiconductor assistant substrate, the source and drain regions can be formed by an epitaxial process. In the case that the semiconductor assistant substrate contains Si, for a PMOS device, the material of the source and drain regions can be $Si_{1-x}Ge_x$, and for an NMOS device, the material of the source and drain regions can be Si:C, which facilitates the utilizing of the source and drain regions to adjust the stress in the channel, so as to increase the carrier mobility in the channel.

When using the epitaxial process to form the source and drain regions, a source/drain base layer (a crystal seed layer, which can be the residual first semiconductor layer of the partial thickness) needs to be formed before forming the source and drain regions. After the source/drain base layer has been formed, the first semiconductor layer on the first sides of the semiconductor substrate will be partially exposed, and thus, a first ion implantation can be performed along a direction towards the first sides, so as to form a doped region in the channel of the device (such as a diffusion region and a halo). This facilitates practical operations and a reduction of the distance between adjacent semiconductor substrates, thus reducing the area of the device and the manufacturing costs.

BRIEF DESCRIPTION OF THE DRAWINGS

Each of the following sectional views is obtained by cutting the formed structure along the line AA' given in the respective top view.

DETAILED DESCRIPTION OF THE PREFERRED EMBODIMENTS

The following disclosure provides various embodiments or examples for realizing the technical solutions provided by the present invention. Although parts and arrangements in the particular examples will be described hereinafter, they are merely taken as examples and not intended to limit the present invention.

In addition, in the present invention, reference numerals and/or letters can repeated in the different embodiments. Such repetitions are for the purpose of simplicity and clarity, and they do not indicate the relationships between various embodiments and/or arrangements discussed.

The present invention provides examples of various particular processes and/or materials; however, the alternative applications of other processes and/or other material, which one skilled in the art would appreciate, obviously do not depart from the protective scope claimed for the present invention. It needs to emphasize that the mutual relationships between various structures described in this document include necessary extensions made due to the needs of these processes or manufacturing procedures, for example, the term "perpendicular" means that the difference between the angle between two planes and 90° is within the scope permissible by the processes or manufacturing procedures. In addition, in this document, the term "connected to" means a direct contact between two structures, and the term "located on•••" means that other structures may be intervened between two structures.

Figure 2:
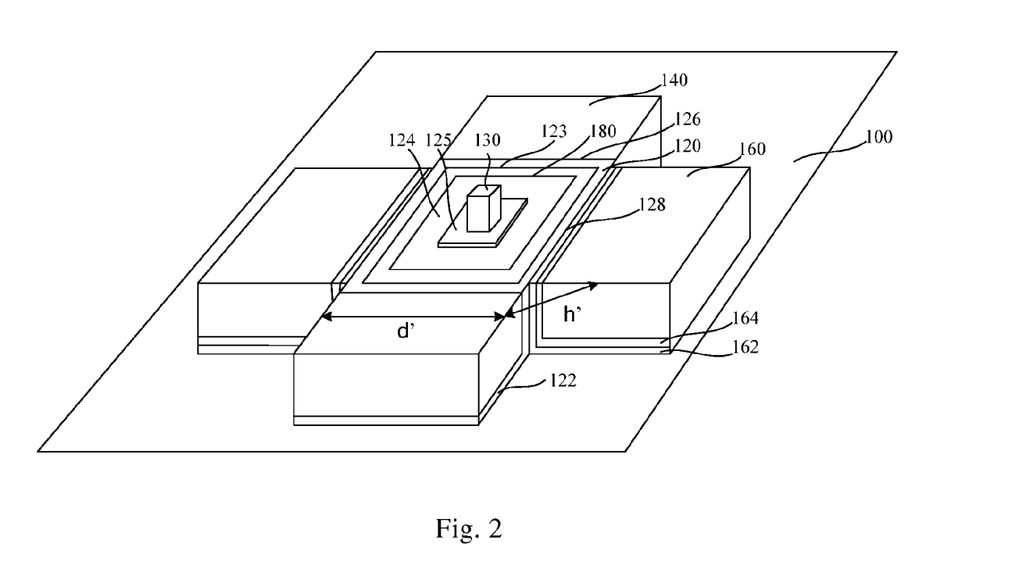
FIG. 2 is a schematic diagram of the structure of a semiconductor device provided by the present invention.

As shown in FIG. 2, a semiconductor device according to the present invention comprises a semiconductor substrate 120 that is located on an insulating layer 100; source and drain regions 140 abutting first opposite sides 126 of the semiconductor substrate 120; first gates 160 located on second opposite sides 128 of the semiconductor substrate 120; and a second gate located on the insulating layer 100 and embedded at least partially in the semiconductor substrate 120. The second gate comprises a floating gate 124 on the semiconductor substrate 120, wherein a first dielectric layer 123 is sandwiched between the floating gate 124 and the semiconductor substrate 120; and a control gate 130 on the floating gate 125, wherein a second dielectric layer 125 is sandwiched between the control gate 130 and the floating gate 124.

By forming the second gate embedded at least partially in the semiconductor substrate 120, for a semiconductor substrate 120 having a channel region of the same thickness as that in prior art, the distance between the first gates 160 formed on second sides 128 of the semiconductor substrate 120 can be increased, which further increases the distance between a first gate 160 and the source/drain region 140, thus facilitating the reduction of parasitic capacitances. Furthermore, due to the introduction of the second gate, provided that the height of the semiconductor substrate 120 is kept constant, the lateral area of the semiconductor substrate 120 having a channel region of the same thickness as that in prior art is increased, and so is the cross sectional area of the source/drain region 140 abutting the semiconductor substrate 120 (because of the increased width of the source/drain region 140), thus facilitating a further reduction of the resistances of the source and drain regions 140. Moreover, by introducing the second gate, a division region is formed between the source and drain regions 140, and it facilitates the reduction of short-channel effects. Still further, since the second gate is embedded at least partially in the semiconductor substrate 120, the use of the channel layer close to the first gate 160 is facilitated; and, and for the second gate, the thickness range of the first dielectric layer 123 and/or the second dielectric layer 125 therein can be larger. In addition, by using the semiconductor device according to the present invention, the first gates 160 can be used as a switch, and the second gate can be used to realize data storage functions.

The semiconductor substrate 120 may be silicon formed on the insulating layer 100, with doped regions (such as diffusion regions and halos) already formed in the semiconductor substrate 120 to provide a channel region for the device. In one embodiment of the semiconductor device, a channel layer and a mask layer are formed between the semiconductor substrate 120 and the top part of the first dielectric layer 123, and the channel layer is formed between the semiconductor substrate 120 and the mask layer. The material of the channel layer may be silicon (in which a doped region has already been formed), and in a direction perpendicular to the second sides, the channel layer has a thickness of 5 nm to 40 nm. The material of the mask layer may be silicon nitride, or a stack of silicon oxide and silicon nitride. The first sides may be perpendicular to the second sides.

The semiconductor device may further comprise a semiconductor assistant substrate 122 abutting a first side 126, and the source/drain region 140 may be formed on the semiconductor assistant substrate 122. As an example, the material of the semiconductor assistant substrate 122 may also be silicon, and then the source/drain region 140 may be formed on the semiconductor assistant substrate 122 using an ion implantation process. In addition, the upper surface of the semiconductor assistant substrate 122 may be lower than the upper surface of the semiconductor substrate 120. In this description, the upper surface refers to the side surface of the semiconductor assistant substrate 122 or the semiconductor substrate 120 parallel to the insulating layer 100. Then, the source/drain region 140 may be formed on the semiconductor assistant substrate 122 using an epitaxial process. In the case that the semiconductor assistant substrate 122 contains Si, for a PMOS device, the material of the source/drain region 140 may be $Si_{1-x}Ge_x$ (X has a value ranging from 0.1 to 0.7 and may be adjusted flexibly depending on the need of the process, such as 0.2, 0.3, 0.4, 0.5, or 0.6, and unless specified otherwise in this document, X may be the same values as described here, which will not described redundantly); and for an NMOS device, the material of the source/drain regions 140 may be Si:C (the atomic number percentage of C may be in a range of 0.2% to 2%, such as 0.5%, 1% or 1.5%, the content of C may be adjusted flexibly depending on the need of the process, and unless specified in this document, the atomic number percentage of C may be the same values as described here, which will not described redundantly). Thus, the source/drain region 140 may be utilized to further adjust the stress in the channel region, so as to increase the carrier mobility in the channel region.

The first gate 160 may be formed on the second side 128 through a stack of a gate dielectric layer 162 and a work function metal layer 164. Each of the gate dielectric layer 162, the first dielectric layer 123, and the second dielectric layer 125 may be a hafnium-based oxide, such as one of $HfO_2$, HfSiO, HfSiON, HfTaO, HfSiO, or HfZrO, or a combination thereof. The work function metal layer 164 may include one of TiN, TiAlN, TaN or TaAlN, or a combination thereof. The first gate 160 may be a metal gate, preferably a polycrystalline silicon gate for a better control of process. The material of the floating gate and/or the control gate may be one of TiN, TiAlN, TaN, or TaAlN, or a combination thereof, and preferably TiN for facilitating the process integration.

In a direction perpendicular to the insulating layer 100, the first gate 160 or the floating gate 124 covers at least the channel layer, facilitating the increase of the effective area of the channel region and in turn enhancing the carrier mobility in the channel region.

The present invention also provides the method for forming the semiconductor device.

Figure 3:
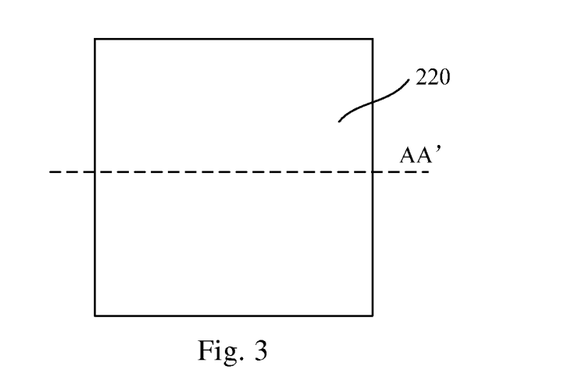
FIGS. 3 and 4 are a top view and a sectional view after having formed on the substrate each material layer needed to form a semiconductor device, in an embodiment of the method for forming a semiconductor device according to the present invention.
Figure 4:
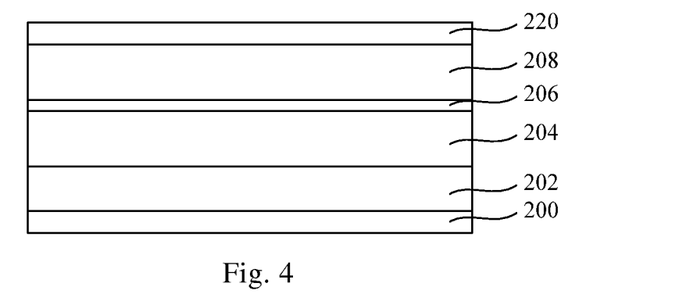
Figure 5:
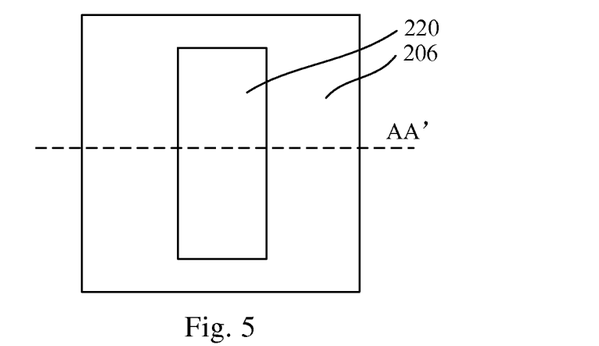
FIGS. 5 and 6 are a top view and a sectional view after having patterned a protection layer and a sacrifice layer, in an embodiment of the method for forming a semiconductor device according to the present invention.
Figure 6:
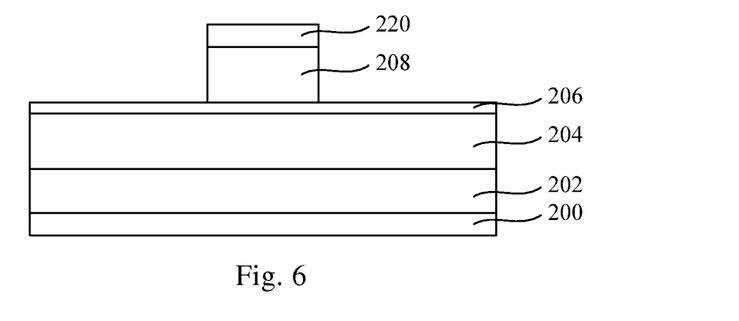
Figure 7:
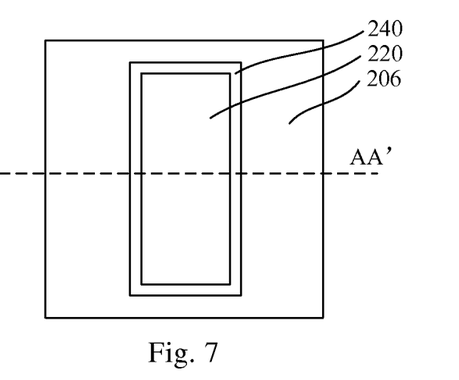
FIGS. 7 and 8 are a top view and a sectional view after having formed a first sidewall, in an embodiment of the method for forming a semiconductor device according to the present invention.
Figure 8:
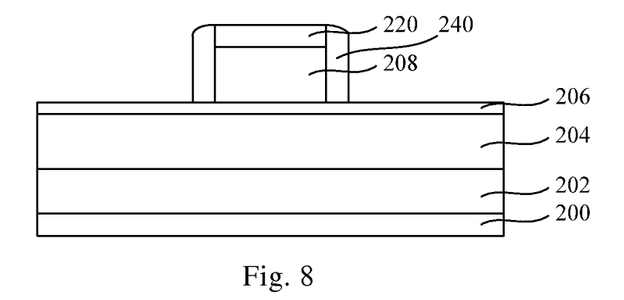

First, as shown in FIGS. 3 and 4, on an silicon-on-insulator (the silicon layer therein is the first semiconductor layer, the first semiconductor layer may also be other semiconductors, the silicon-on-insulator comprises an insulating layer 202 and a silicon layer 204 formed sequentially on a substrate 200, the substrate 200 is preferably a silicon substrate), a stopper layer 206 (it can be silicon oxide), a sacrifice layer 208 (it can be an amorphous silicon), and a protection layer 220 (it can be silicon carbide) are sequentially formed, and as shown in FIGS. 5 and 6. Then, the protection layer 220 and the sacrifice layer 208 are patterned. The patterning operation may be performed using an etching process, and the etching operation stops on the stopper layer 206. Next, as shown in FIGS. 7 and 8, a first sidewall spacer 240 is formed surrounding the patterned protection layer 220 and the patterned sacrifice layer 208. The material of the first sidewall spacer 240 may be silicon nitride, and the first sidewall spacer 240 may be formed using an etching back process. In this case, the first sides may be perpendicular to the second sides.

The thickness of the silicon layer 204 may be 50 nm to 100 nm, for example, 60 nm, 70 nm, 80 nm or 90 nm. The thickness of the stopper layer 206 may be 5 nm to 20 nm, for example, 8 nm, 10 nm, 15 nm or 18 nm. The thickness of the sacrifice layer 208 may be 30 nm to 80 nm, for example, 40 nm, 50 nm, 60 nm or 70 nm. The thickness of the protection layer 220 may be 20 nm to 50 nm, for example, 25 nm, 30 nm, 35 nm or 40 nm. In a direction perpendicular to the second sides, the thickness of the first sidewall spacer 240 may be 5 nm to 40 nm, for example, 10 nm, 20 nm, 25 nm or 30 nm.

Figure 9:
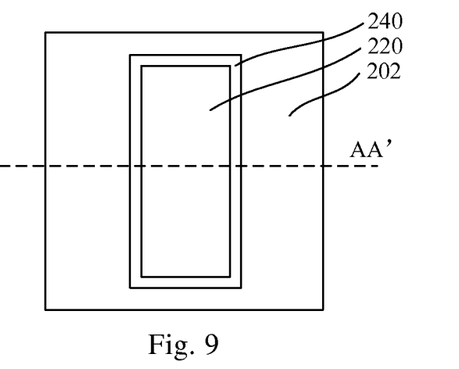
FIGS. 9 and 10 are a top view and a sectional view after having patterned a stop layer and a silicon layer, in an embodiment of the method for forming a semiconductor device according to the present invention.
Figure 10:
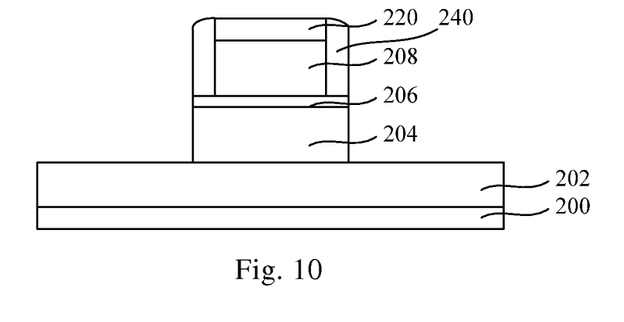
Figure 11:
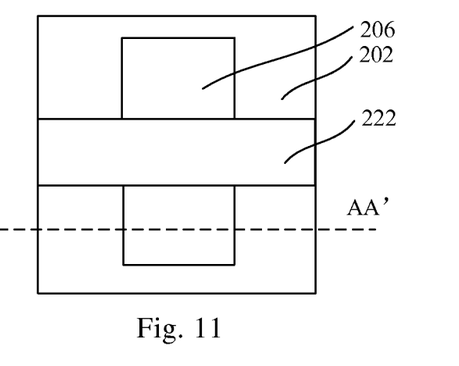
FIGS. 11 and 12 are a top view and a sectional view after exposing a stop layer in an area of a source-drain region, in an embodiment of the method for forming a semiconductor device according to the present invention.
Figure 12:
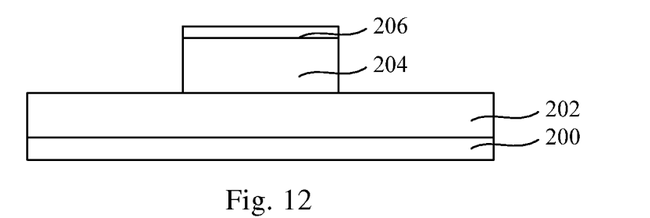
Figure 13:
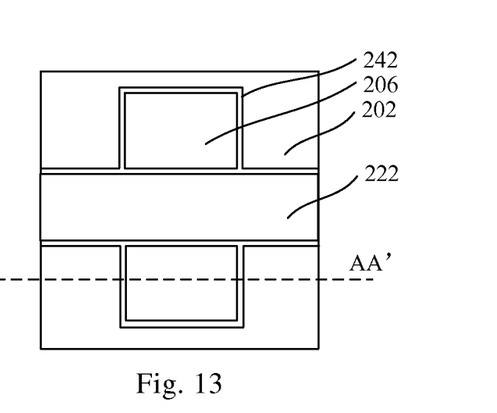
FIGS. 13 and 14 are a top view and a sectional view after having formed a second sidewall, in an embodiment of the method for forming a semiconductor device according to the present invention.
Figure 14:
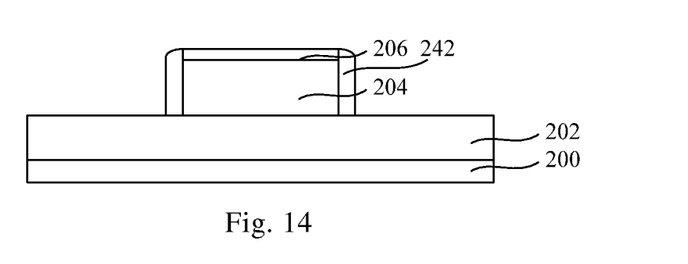

Then, as shown in FIGS. 9 and 10, the stopper layer 206 and the silicon layer 204 are patterned with the first sidewall spacer 240 as a mask, and the patterning may be performed using an etching process which stops on the insulating layer 202. Next, as shown in FIGS. 11 and 12, areas for the source and drain regions are defined, and the first sidewall spacer 240, the protection layer 220, and the sacrifice layer 208 located in the areas are removed, so as to expose the stopper layer 206 (a hard mask 222 may be formed on the areas which are not the source or drain region, the hard mask 222 may be formed on the protection layer 220 in the above mentioned step, the hard mask may be removed in an appropriate step, for example, after exposing the stopper layer 220 in the source and drain regions). At the same time, the side surfaces (not shown in the figures) of the protection layer 220 and the sacrifice layer 208 adjacent to the source/drain region are exposed. Next, as shown in FIGS. 13 and 14, a second sidewall spacer 242 (which may be silicon nitride) is formed to surround the protection layer 220, the sacrifice layer 208, the patterned stopper layer 206, and the patterned silicon layer 204. By now, a semiconductor base structure has been formed. Next, after the source and drain regions and the first gate have been formed, the protection layer 220, the sacrifice layer 208, the stopper layer 206, and the silicon layer 204 are removed with the first sidewall spacer 240 and the second sidewall spacer 242 as a mask (namely, the protection layer 220, the sacrifice layer 208, the stopper layer 206, and the silicon layer 204 covered by the first sidewall spacer 240 or the second sidewall 242 spacer, are not removed), so as to expose the insulating layer 202. Now, a void has been formed. Then, a second gate is formed, such that the void is filled with at least one part of the second gate. Thus, the semiconductor device is formed. By forming the semiconductor base structure in a self alignment manner (which will form the semiconductor substrate later), the number of masks needed can be reduced and the processing can be refined. The thickness of the second sidewall spacer 242 may be 7 nm to 20 nm, such as 10 nm, 15 nm, or 18 nm.

It needs to emphasize that the first gate (actually, it is a gate stack comprising the gate; the gate stack may comprise a stack of a gate dielectric layer, a work function metal layer, and a polycrystalline silicon layer; and the polycrystalline silicon layer may also be replaced with a stack of metal layers) may be formed after patterning the stopper layer and the silicon layer, and before exposing the stopper layer located in the areas for the source and drain regions.

Figure 15:
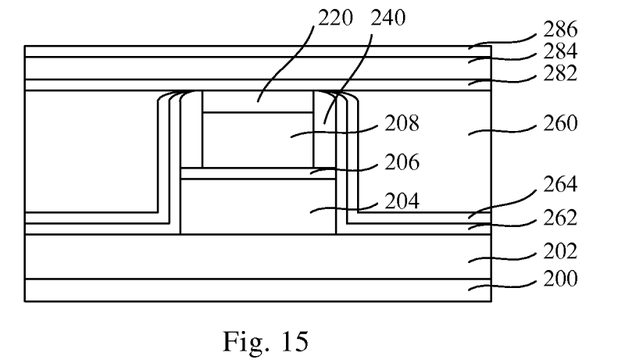
FIG. 15 is a structural sectional view after having formed a gate stack following the step shown in FIGS. 9 and 10, in an embodiment of the method for forming a semiconductor device according to the present invention.

Particularly, as shown in FIG. 15, after patterning the stopper layer 206 and the silicon layer 204 (as shown in FIGS. 9 and 10), a gate stack (in which the gate stack comprises a gate dielectric layer 262, a work function metal layer 264 and a gate material layer 260 which are accumulated in succession, the gate dielectric layer 262 may select a hafnium-based oxide, such as one of Hf02, HfSiO, HfSiON, HfTaO, HfSiO or HfZrO, or a combination thereof; the work function metal layer 264 may comprise one of TiN, TiAlN, TaN or TaAlN, or a combination thereof; and the gate material layer 260 may be metal, preferably polycrystalline silicon) is formed on the insulating layer 202. Subsequently, the gate stack is planarized to expose the protection layer 220. Furthermore, an assistant mask layer is formed covering the gate stack and the protection layer 220. The assistant mask layer may be a stack of dielectric layers of different materials, for example, if the material of the protection layer 220 and the first sidewall spacer 240 is silicon nitride, the assistant mask layer may be a silicon oxide layer (a first assistant mask layer 282)-silicon nitride layer (a second assistant mask layer 284)-silicon oxide layer (a third assistant mask layer 286).

After the above steps, when seen from a top view, there is only a silicon oxide layer on the substrate based on which the above mentioned structures are formed. After that, it also needs to remove the assistant mask layer and the gate stack in the areas for the source and drain regions before the formation of the semiconductor base structure. The above mentioned method for forming the first gates is a result of manufacturing process integration by comprehensive considerations, and the following description is based thereon. It needs to point out that the first gates may also be formed by using other methods, and the first gates may also be formed after forming the source and drain regions. According to the teachings provided by the present invention, one skilled in the art will be able to form the first gates in a flexible way, which will not be described redundantly.

The thickness of the gate dielectric layer 262 may be 2 nm to 3 nm, for example, 2.5 nm. Further, an interfacial oxide layer may be formed before forming the gate dielectric layer 262, and the thickness of the interfacial oxide layer may be 0.2 nm to 0.7 nm, for example, 0.5 nm, which is not shown in the figure. The thickness of the work function metal layer 264 may be 3 nm to 10 nm, for example, 5 nm or 8 nm. The thickness of the gate material layer 260 may be 50 nm to 100 nm, for example, 60 nm, 70 nm, 80 nm or 90 nm. The thickness of the first assistant mask layer 282 may be 2 nm to 5 nm, for example, 3 nm or 4 nm. The thickness of the second assistant mask layer 284 may be 10 nm to 20 nm, for example, 12 nm, 15 nm or 18 nm. The thickness of the third assistant mask layer 286 may be 10 nm to 20 nm, for example, 12 nm, 15 nm or 18 nm. The thickness of the source/drain base layer may be 5 nm to 20 nm, for example, 10 nm or 15 nm.

Figure 16:
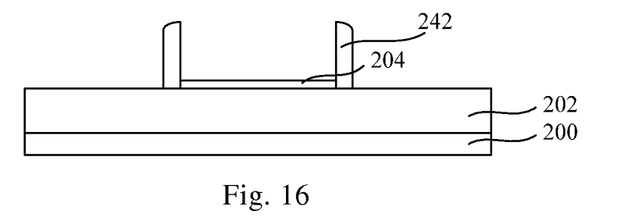
FIG. 16 is a structural sectional view after having formed a source-drain base layer in the area of the source-drain region, in an embodiment of the method for forming a semiconductor device according to the present invention.
Figure 17:
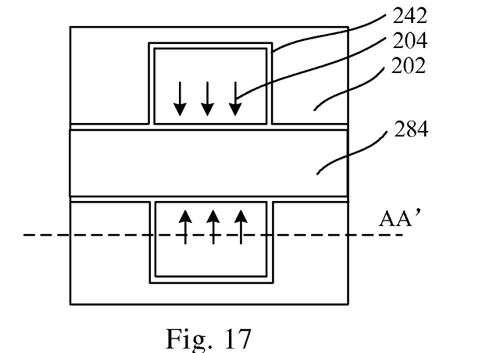
FIG. 17 is a sectional view of performing a first ion injecting operation after having formed a source-drain base layer, in an embodiment of the method for forming a semiconductor device according to the present invention.
Figure 18:
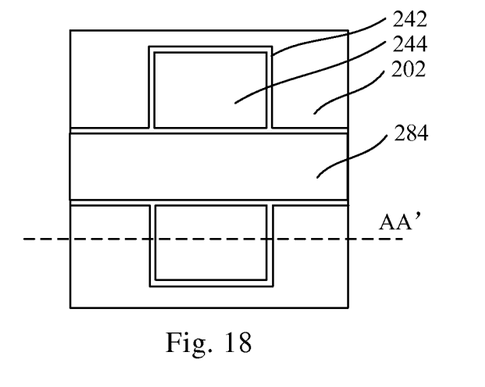
FIGS. 18 and 19 are a top view and a sectional view after having formed a second semiconductor layer on the source-drain base layer, in an embodiment of the method for forming a semiconductor device according to the present invention.
Figure 19:
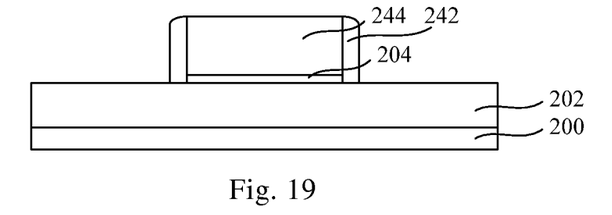

In practice, as shown in FIG. 16, after forming the semiconductor base structure, the stopper layer 206 and the silicon 204 of a partial thickness in the areas for the source and drain regions are removed (the first assistant mask 286, i.e., a silicon oxide layer on the gate stack is also removed), so as to form a source/drain base layer (i.e., a semiconductor assistant substrate). The thickness of the source/drain base layer may be 5 nm to 20 nm, for example, 10 nm or 15 nm. Then, as shown in FIG. 17, a first ion implantation is performed along a direction (the direction denoted by the arrows in the figure) towards the first sides (the first sides are the exposed surface of the silicon layer after removing a partial thickness), so as to form a diffusion region and a halo in the silicon layer 204. Compared with performing the first ion implantation along a direction towards the second sides as in the prior art, it is more easy to implement the operations provided by the invention in practice, and the distance between adjacent semiconductor base structures may be reduced, thus reducing the areas occupied by the device and the manufacturing costs. The processing particularities of the first ion implantation, such as the implant energy, the implant dose, the number of times of implantation, and the dopants, may all be adjusted flexibly depending on the design of the device, which will not be described redundantly. Next, as shown in FIGS. 18 and 19, after forming a second semiconductor layer 244 on the source/drain base layer by an epitaxial method (for a PMOS device, the material of the second semiconductor layer 244 is $Si_{1-x}Ge_x$ and the doping dose may be $1\times10^{19}/cm^3$ to $1\times10^{21}/$ cm3; and for an NMOS device, the material of the second semiconductor layer 244 is Si:C and the doping dose may be 1×1019/cm3 to 1×1021/cm3), the source/drain region is formed. The source and drain regions can be used to further adjust the stress in the channel region, so as to increase the carrier mobility in the channel region. In addition, the source and drain regions may also be formed not by removing the silicon layer 204 of a partial thickness after removing the stopper layer 206 in the source and drain regions. Instead, they may be formed by conducting an ion implantation in the silicon layer 204.

Figure 20:
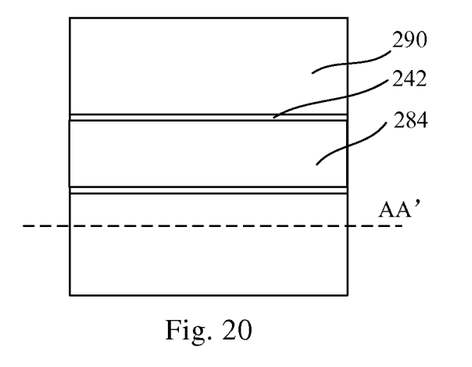
FIGS. 20 and 21 are a top view and a sectional view after having formed a first dielectric layer which is flattened, in an embodiment of the method for forming a semiconductor device according to the present invention.
Figure 21:
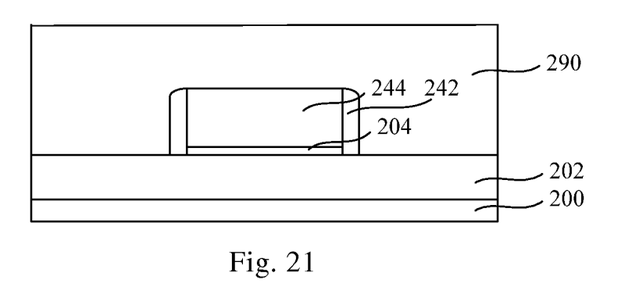
Figure 22:
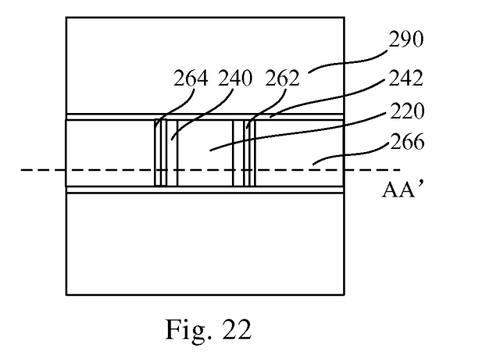
FIGS. 22 and 23 are a top view and a sectional view after having formed a gate, in an embodiment of the method for forming a semiconductor device according to the present invention.
Figure 23:
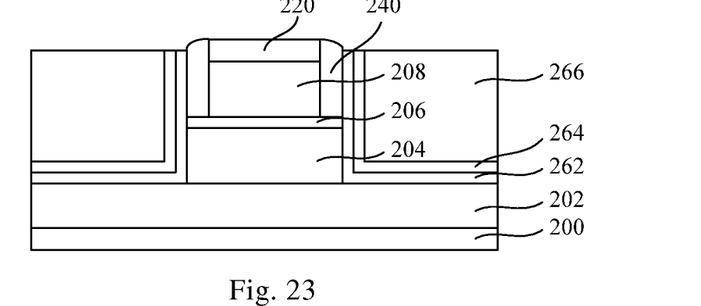
Figure 24:
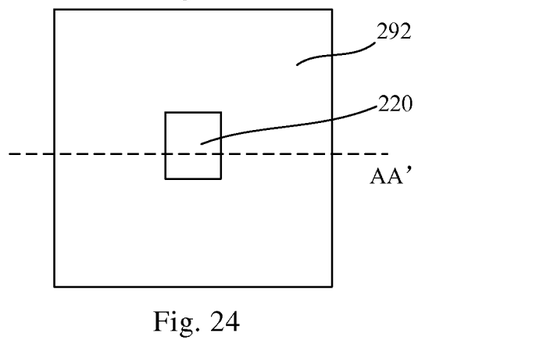
FIGS. 24 and 25 are a top view and a sectional view after having formed a second dielectric layer which is flattened, in an embodiment of the method for forming a semiconductor device according to the present invention.
Figure 25:
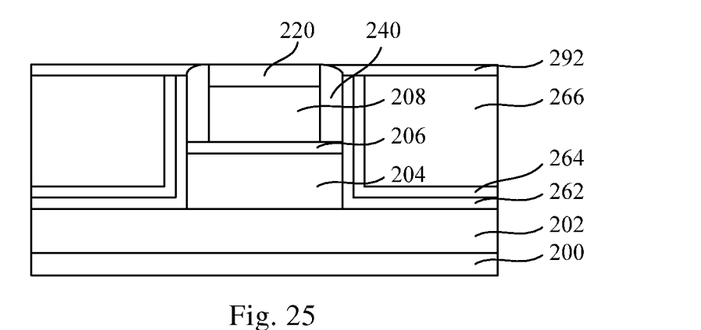
Figure 26:
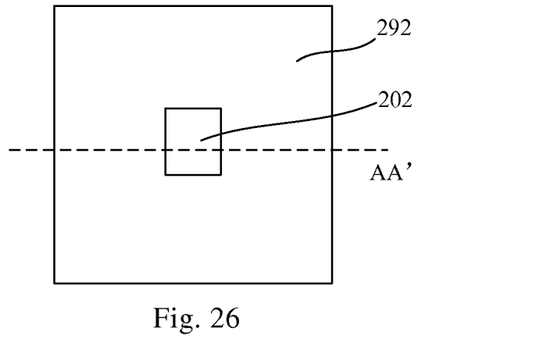
FIGS. 26 and 27 are a top view and a sectional view after having formed a void, in an embodiment of the method for forming a semiconductor device according to the present invention.
Figure 27:
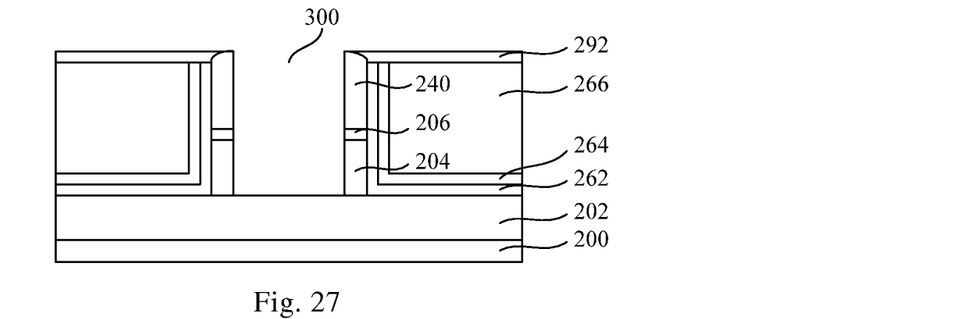

Next, a void is formed. Firstly, as shown in FIGS. 20 and 21, a first dielectric layer 290 (such as silicon oxide) is formed and planarized, and a second assistant mask layer 284 in the assistant mask layer is exposed. The second assistant mask layer 284 may be exposed by CMP (Chemical Mechanical Polishing). Subsequently, as shown in FIGS. 22 and 23, the assistant mask layer in which the residual second assistant mask layer 284 (a silicon nitride layer), the residual first assistant mask layer 282 (a silicon oxide layer), and the gate stack of a partial thickness are removed, so as to form first gates 266. In the direction of the thickness of the silicon layer 204, the first gates 266 covers at least the silicon layer 204 (for forming a channel) for increasing the effective area of the channel of the device and further for increasing the carrier mobility in the channel. After this step, the protection layer 220 of a residual thickness still remains. Next, as shown in FIGS. 24 and 25, a second dielectric layer 292 (such as silicon oxide for reducing the damage of the existing structure when removing the protection layer 220 to form the void) is formed. The second dielectric layer 292 exposes the protection layer 220 but covers the first sidewall 240 and the second sidewall 242. The above operation may be performed by depositing the second dielectric layer 292 and then carrying out a CMP process on the second dielectric layer 292. Then, as shown in FIGS. 26 and 27, by using the second dielectric layer 292 as a mask, the protection layer 220, the sacrifice layer 208, the stopper layer 206, and the silicon layer 204 are removed to expose the insulting layer 202, so as to form a void 300. It needs to be pointed out that, it is due to the protection of the second dielectric layer 292 that the formation of the void 300 has a smaller impact on other structures, but the shape of the void 300 is determined by the existence of the first sidewall 240 and the second sidewall 242. Therefore, to some extent, the first sidewall 240 and the second sidewall 242 also function as a mask. Since the void 300 is formed after having formed the source and drain regions, the counter forces on the source and drain regions imposed by the silicon layer 204 (the first semiconductor layer), the stopper layer 206, and the sacrifice layer 208 which are originally filled in the void 300 disappear, the loss of the stress in the source and drain regions becomes smaller.

Figure 28:
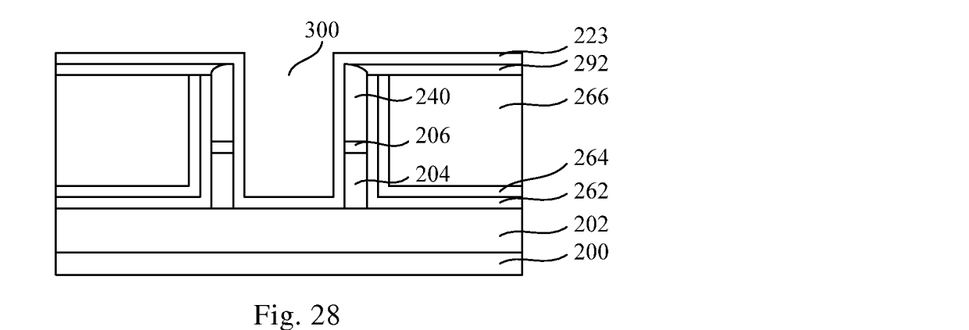
FIGS. 28 to 32 are section views of each intermediate structure when forming the second gate, in an embodiment of a method for forming a semiconductor device of the present invention.

Next, as shown in FIG. 28, after forming the void 300, a floating gate dielectric layer 223 (i.e., a first dielectric layer) is formed, A deposition process may be used to form the floating gate dielectric layer 223, and the floating gate dielectric layer 223 covers the bottom wall (i.e., the insulating layer 202 is exposed by the void) and sidewalls (which comprise the first semiconductor layer 204 abutting the insulating layer 202, the stopper layer 206 abutting the first semiconductor layer 204, and the first sidewall 240 or the second sidewall 242 abutting the stopper layer 206) of the void 300, and the second dielectric layer 292.

Figure 29:
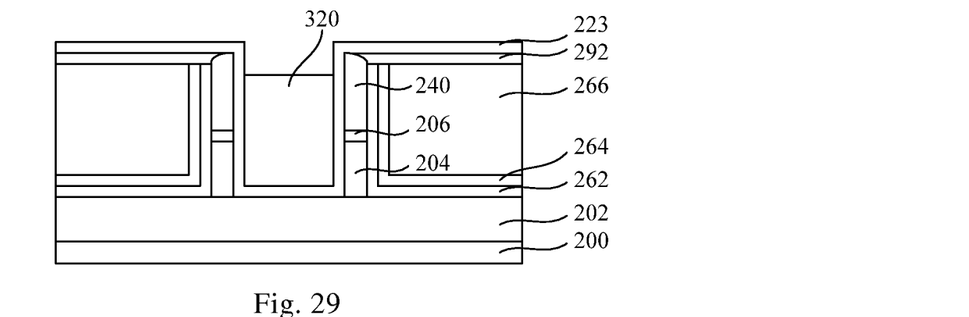

Subsequently, as shown in FIG. 29, a floating gate 320 is formed on the floating gate dielectric layer 223 by using an etching back process, so as to fill the cavity 300.

The floating gate 320 may be formed of a metal material, such as one of TiN, TiAlN, TaN or TaAlN, or a combination thereof, and preferably TiN for facilitating the process integration. In the direction perpendicular to the insulating layer 202, the floating gate covers at least the first semiconductor layer 204, facilitating the increase of the effective area of the channel region and in turn increasing the carrier mobility in the channel region.

Figure 30:
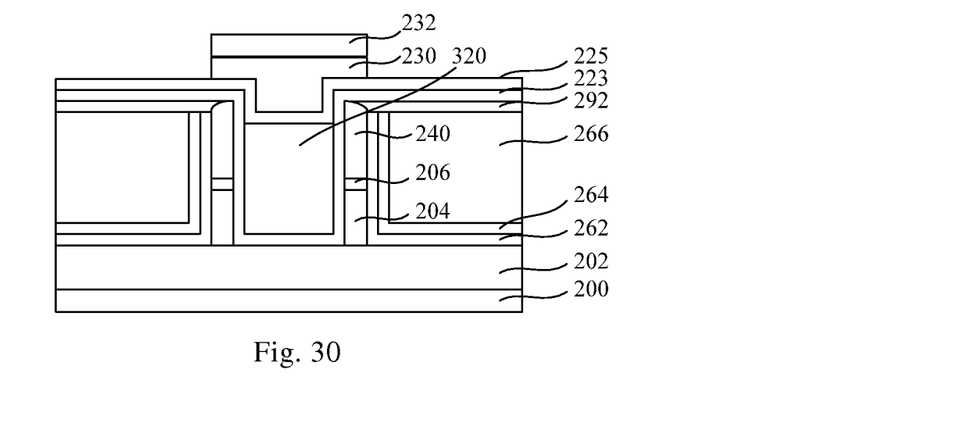
Figure 31:
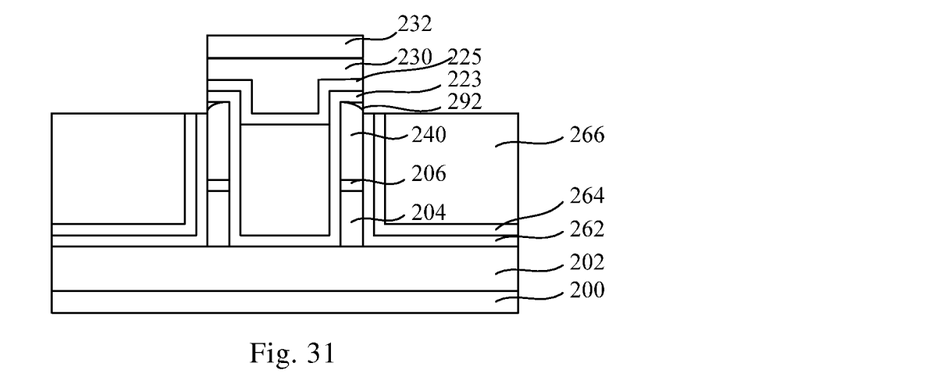

After that, as shown in FIG. 30, a control gate dielectric layer 225 (i.e., a second dielectric layer) and a control gate 230 are formed. The control gate dielectric layer 225 covers the floating gate dielectric layer 223 and the floating gate 320, and the control gate 230 abuts the control gate dielectric layer 225 adjacent to the floating gate 320 and the floating gate dielectric layer 223. A deposition process may be adopted to form the control gate dielectric layer 225, and the control gate 230 may be etched to have any pattern according to the design requirements (then, it is necessary to use the hard mask 232 formed on the control gate 230). Next, as shown in FIG. 31, by using the hard mask 232, the second dielectric layer 292, and the floating gate dielectric layer 223 and the control gate dielectric layer 225 which cover the second dielectric layer 292, are removed, thus exposing the first gate 266 and the source and drain regions 244. It needs to be pointed out that, although in the embodiment shown in the figures, the floating gate dielectric layer 223 abuts the control gate dielectric layer 225, but in other embodiments, according to the processing needs, the floating gate dielectric layer 223 and the control gate dielectric layer 225 may not abut each other (not shown).

Figure 32:
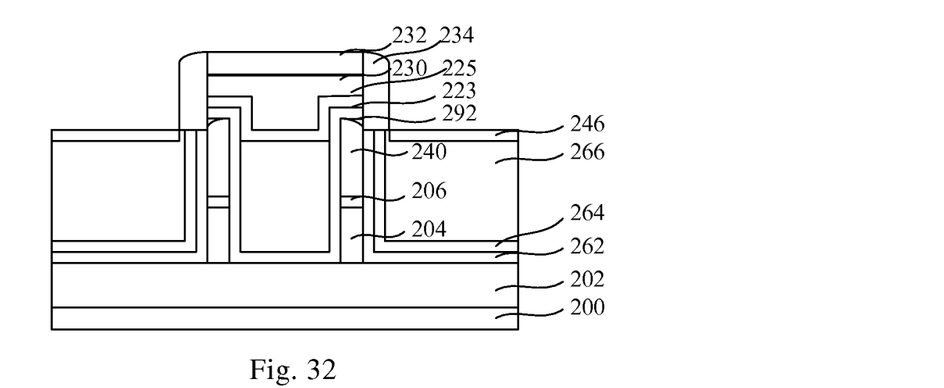

After that, as shown in FIG. 32, a protective sidewall spacer 234 is formed. The protective sidewall 234 surrounds the structure obtained after removing the second dielectric layer 292, and the floating gate dielectric layer 223 and the control gate dielectric layer 225 which cover the second dielectric layer 292. A metal layer is formed on the first gate 266 and the source and drain regions 244 and is subjected to a heat treatment operation, and then the unreacted part of the metal layer is removed, so as to form a metal silicide layer 246 (namely, a contact region for reducing the contact resistance when forming the subsequent metal interconnection) on the first gate 266 and the source and drain regions 244.

In this case, the thickness of the floating gate dielectric layer 223 may be 2 nm to 15 nm, for example, 5 nm, 8 nm, 10 nm, or 12 nm. The thickness of the floating gate 320 may be 3 nm to 10 nm, for example, 5 nm or 8 nm. The thickness of the control gate dielectric layer 225 may be 2 nm to 15 nm, for example, 5 nm, 8 nm, 10 nm, or 12 nm. The thickness of the control gate 230 may be 3 nm to 10 nm, for example, 5 nm or 8 nm. The floating gate dielectric layer 223 and/or the control gate dielectric layer 225 may be a hafnium-based oxide, for example, one of HfO2, HfSiO, HfSiON, HfTaO, HfTiO or HfZrO, or a combination thereof.

Moreover, the application scope of the present invention is not limited to processes, structures, manufacturing, substance composition, means, methods and steps of the particular embodiments described in the specification. According to the disclosure of the present invention, one skilled in the art would readily understand that for processes, structures, manufacturing, substance composition, means, methods or steps currently existing or to be developed in future, when they perform the substantially same functions as that of the respective embodiments described in the present invention or produce the substantially same effects, they can be applied according to the teachings of the present invention, without departing from the protective scope claimed for the present invention.

What is claimed is:

1. A semiconductor device, comprising:
a semiconductor substrate on an insulating layer, the semiconductor substrate comprising first opposite sides and second opposite sides;
one pair of source region and a drain regions, each of which abuts a respective one of the first opposite sides;
a first pair of gates, each of which is located on a respective one of the second opposite sides; and
a second gate, which is embedded at least partially in the semiconductor substrate so that the second gate is surrounded by the semiconductor substrate and the bottom of the second gate is located in the semiconductor substrate,
wherein, the second gate comprises:
a floating gate surrounded by the semiconductor substrate, wherein a first dielectric layer is sandwiched between the floating gate and the semiconductor substrate;
a control gate on the floating gate, wherein a second dielectric layer is sandwiched between the control gate and the floating gate.

2. The semiconductor device according to claim 1, wherein a channel layer and a mask layer are formed between the top part of the first dielectric layer and the semiconductor substrate, and the channel layer is formed between the semiconductor substrate and the mask layer.

3. The semiconductor device according to claim 2, wherein the channel layer has a thickness of 5 nm to 40 nm in a direction perpendicular to the second sides.

4. The semiconductor device according to claim 2, wherein, in a direction perpendicular to the insulating layer, the first pair of gates or the floating gate covers at least the channel layer.

5. The semiconductor device according to claim 1, wherein the material of the floating gate and/or the control gate is one of TiN, TiAlN, TaN or TaAlN, or a combination thereof.

6. The semiconductor device according to claim 1, wherein the material of the first dielectric layer and/or the second dielectric layer is one of hafnium-based oxides.

7. The semiconductor device according to claim 1, wherein the first sides are perpendicular to the second sides.

8. The semiconductor device according to claim 1, wherein the semiconductor device further comprises a semiconductor assistant substrate, the upper surface of the semiconductor assistant substrate is lower than the upper surface of the semiconductor substrate, the semiconductor assistant substrate abuts the first sides, and the source and the drain regions are formed on the semiconductor assistant substrate.

9. The semiconductor device according to claim 8, wherein the semiconductor assistant substrate contains Si; for a PMOS device, the source and drain regions are $Si_{1-X}Ge_X$, and for an NMOS device, the source and drain regions are Si:C.

10. The semiconductor device according to claim 9, wherein, in the $Si_{1-X}Ge_X$, X has a value ranging from 0.1 to 0.7.

11. The semiconductor device according to claim 9, wherein, in the Si:C, the atomic number percentage of C is in a range of 0.2% to 2%.

* * * * *